United States Patent
Yamamoto et al.

(10) Patent No.: US 7,141,300 B2
(45) Date of Patent: *Nov. 28, 2006

(54) ADHESIVE SHEET FOR DICING

(75) Inventors: Shouji Yamamoto, Ibaraki (JP); Kenjiro Takayanagi, Yokkaichi (JP)

(73) Assignee: Nitto Denko Corporation, Osaka (JP)

( * ) Notice: Subject to any disclaimer, the term of this patent is extended or adjusted under 35 U.S.C. 154(b) by 407 days.

This patent is subject to a terminal disclaimer.

(21) Appl. No.: 10/172,893

(22) Filed: Jun. 14, 2002

(65) Prior Publication Data

US 2003/0031862 A1 Feb. 13, 2003

(30) Foreign Application Priority Data

Jun. 27, 2001 (JP) ............................. 2001-194021
Feb. 27, 2002 (JP) ............................. 2002-051682
Feb. 27, 2002 (JP) ............................. 2002-051693

(51) Int. Cl.
*B32B 7/12* (2006.01)
*B22B 15/04* (2006.01)
*C09J 7/02* (2006.01)

(52) U.S. Cl. ........................ 428/343; 428/345; 428/354; 428/500

(58) Field of Classification Search ............. 428/343, 428/345, 373, 500, 411.1, 354; 525/191, 525/240

See application file for complete search history.

(56) References Cited

U.S. PATENT DOCUMENTS 5,458,845 A * 10/1995 Ishii et al. ................. 264/515
5,705,016 A * 1/1998 Senoo et al. .............. 156/289
6,300,415 B1 * 10/2001 Okayama et al. .......... 525/191
6,444,310 B1 * 9/2002 Senoo et al. .............. 428/354
6,506,490 B1 * 1/2003 Yamamoto ................. 428/343

FOREIGN PATENT DOCUMENTS

| DE | 199 23 780 A1 | | 11/2000 |
|---|---|---|---|
| JP | 5-156214 | | 6/1993 |
| JP | 5-211234 | | 8/1993 |
| JP | 5-335411 | | 12/1993 |
| JP | 7-156355 | | 6/1995 |
| JP | 10-77375 | | 3/1998 |
| JP | 2000-173951 | | 6/2000 |
| JP | 2000-173951 A | * | 6/2000 |
| JP | 2002-155249 | | 5/2002 |
| WO | WO 99/35202 | | 7/1999 |

* cited by examiner

*Primary Examiner*—Thao T. Tran
(74) *Attorney, Agent, or Firm*—Knobbe Martens Olson & Bear LLP

(57) ABSTRACT

An adhesive sheet for dicing comprising a base film provided at least one surface thereof with an adhesive layer, wherein the base film comprises an olefinic thermoplastic elastomer comprising propylene and ethylene and/or α-olefin including 4 to 8 carbon atoms as polymerization components, and the peak melting temperature of the olefinic thermoplastic elastomer is 120° C. or more, is free of economical disadvantages with less reduction in the quality level of products and less generation of fibrous off-cuts during dicing. In particular, fibrous off-cuts occur less during dicing when the base film contains a crystal-nucleating agent. Further, generation of chippings during dicing can be prevented by incorporation of an ethylene series polymer into the base film.

3 Claims, 1 Drawing Sheet

ADHESIVE SHEET FOR DICING

BACKGROUND OF THE INVENTION

1. Field of the Invention

The present invention relates to an adhesive sheet for dicing. Further, the present invention relates to a method of dicing by using the adhesive sheet for dicing and to small cut pieces obtained by the dicing method. In case that small element pieces, such as semiconductor wafers cut and separate (dice), the adhesive sheet for dicing according to the present invention is particularly useful as an adhesive sheet for dicing semiconductor wafers, which is used for fixing materials to be cut, such as semiconductor wafers. For example, the adhesive sheet for dicing according to the present invention can be used as an adhesive sheet for dicing silicon semiconductors, an adhesive sheet for dicing compound semiconductor wafers, an adhesive sheet for dicing semiconductor packages, an adhesive sheet for dicing glass, and the like.

2. Description of the Related Art

Conventionally, a semiconductor wafer made of silicon, gallium or arsenic is produced in a state having a large diameter, then cut and separated (diced) into small element pieces, and transferred to a mounting step. In this process, the semiconductor wafer is subjected, in a state maintained by sticking on an adhesive sheet, to the respective steps such as a dicing step, a washing step, an expanding step, a pick-up step and a mounting step. As the adhesive sheet, a sheet including an acrylic series adhesive of about 1 to 200 μm in thickness applied onto a base material consisting of a plastic film is generally used.

In the dicing step, the wafer is cut with a rotating and moving circular blade, but a cutting system called full cutting where the base material of the adhesive sheet for dicing maintained the semiconductor wafer is cut into an inside of the base material, is a mainstream. Since the adhesive sheet is cut into an inside thereof by the full-cutting method, the base material i.e. a plastic film generates fibrous off-cuts. When the fibrous off-cuts adhere to the side of the chip (cut piece), the adhering fibrous off-cuts are mounted and contained in the chip in later steps, to cause a problem of a significant reduction in the reliability of the resultant semiconductor element. In the pickup step, individual chips are picked up after positioning under recognition with a CCD camera, but if there are fibrous off-cuts, there is also an inconvenience that a recognition error is caused.

As a means of solving such problems, for example Japanese Patent Application Laid-Open No. 156214 (1993) proposes an adhesive sheet using an ethylene-methacrylate copolymer as the base material. This adhesive sheet achieves a certain reduction in generation of fibrous off-cuts, but is not satisfactorily endurable in the dicing step in producing highly reliable semiconductors.

Further, Japanese Patent Application Laid-Open No. 211234(1993) proposes an adhesive sheet using a film irradiated with electron rays or radiations such as γ-rays at 1 to 80 MRad. However, this adhesive sheet is severely damaged by irradiation with radiations, thus hardly providing a film excellent in outward appearance and significantly costing in film production, and is thus not preferable in respect of quality level and costs.

A wafer is completely cut in the cutting method by full-cutting, and thus the quality level of the cut is varied depending on the adhesive sheet for dicing used. For example, in recent years as a wafer is thinned, a crack called chipping occurs on the back surface of the wafer, caused a serious problem of a reduction in the anti-bending strength of the wafer.

As a means of solving such problems, for example Japanese Patent Application Laid-Open No.335411(1993) proposes a method of producing a thinned semiconductor element (by conducting dicing first) wherein a semiconductor wafer with an element formed thereon is first subjected to dicing to form a groove of predetermined depth and then subjected to back-grinding to the depth of the diced groove. In this method, occurrence of chipping can be prevented, but since a semiconductor wafer is provided previously with a cut of dozens to hundreds μm in depth by dicing, there arises problems such as cracking prior to the back-grinding step and contamination of the surface of the wafer with grinding water from the groove in the back-grinding step, thus leading to a reduction in the yield of the semiconductor wafer.

SUMMARY OF THE INVENTION

An object of the present invention is to provide an adhesive sheet for dicing being free of economical disadvantages with less reduction in the quality level of products and less generation of fibrous off-cuts during dicing, to solve the problems in the prior art described above.

Another object of the present invention is to provide an adhesive sheet for dicing capable of achieving good yield of cut pieces such as semiconductor wafers and capable of preventing occurrence of chippings during dicing, to solve the problems in the prior art described above.

A further object of the present invention is to provide a method of dicing with the adhesive-attached sheet for dicing.

A still further object of the present invention is to provide small cut pieces obtained by the dicing method.

To solve the problems described above, the present inventors made extensive study on the base film constituting the adhesive sheet for dicing, and as a result, they found that the object described above can be achieved by using a specific olefinic thermoplastic elastomer in the base film, thus arriving at completion of the present invention.

That is, the invention relates to an adhesive sheet for dicing, comprising a base film provided at least one surface thereof with an adhesive layer, wherein the base film comprises an olefinic thermoplastic elastomer containing propylene and ethylene and/or $C_{4-8}$ α-olefin as polymerization components, and the peak melting temperature of the olefinic thermoplastic elastomer is 120 to 170° C.

The present inventors found that among olefinic thermoplastic elastomers particularly containing propylene and ethylene and/or $C_{4-8}$ α-olefin as polymerization components, and constituting the base film of the adhesive sheet for dicing according to the present invention, an elastomer having a peak melting point of 120 to 170° C. achieves a reduction in the elongation of the base film during dicing thereby preventing generation of fibrous off-cuts during dicing. The peak melting point of the olefinic thermoplastic elastomer is preferably 140° C. or more, more preferably 160° C. or more. The peak melting point is measured generally by a differential scanning calorimeter (DSC) in accordance with JIS K7121.

In the adhesive sheet for dicing, the ratio of an eluted fraction of the olefinic thermoplastic elastomer at 0° C. to total eluted fractions thereof in temperature rising elution fractionation at temperatures ranging from 0 to 140° C. in o-dichlorobenzene as the solvent is preferably 10 to 60% by weight.

The ratio of an eluted fraction of the olefinic thermoplastic elastomer at 0° C. to total eluted fractions thereof is in such a preferable range that generation of fibrous off-cuts during dicing can be prevented, and the expanding properties of the base film and the adhesion thereof to the adhesive layer can be satisfied. When the ratio of the eluted fraction thereof at 0° C. is lower, a base film obtained by molding the olefinic thermoplastic elastomer is rigid to worsen stretch ability during expanding step and to make pickup difficult, so the ratio of the eluted fraction at 0° C. is preferably 10% by weight or more, more preferably 20% by weight or more. On the other hand, when the ratio of the eluted fraction at 0° C. is higher, the adhesion of a base film obtained by molding the olefinic thermoplastic elastomer to the adhesive layer is lowered, and thus the ratio of the eluted fraction at 0° C. is preferably 60% by weight or less, more preferably 50% by weight or less.

The temperature rising elution fractionation (TREF) is a known analysis method. From the viewpoint of principle, a polymer is dissolved completely at a high temperature in a solvent and then cooled to form a thin polymer layer on the surface of an inert carrier allowed to be present in the solution. During this process, polymer layers of from easily crystallizable, highly crystallizable components to hardly crystallizable, low crystallizable or non-crystal components are formed in this order. Then, when the polymer layers are heated continuously or stepwise, the elution thereof occurs in the opposite order, that is, the hardly crystallizable or non-crystal components are first eluted, and the highly crystallizable components are finally eluted. From an elution curve drawn by plotting the amounts of eluted fractions at elution temperatures against the elution temperature, the distribution of the components in the polymer can be analyzed.

As the measuring device, a cloth fractionation device (CFC•T150A, MITSUBISHI CHEMICAL CORPORATION) was used. A sample to be measured (olefinic thermoplastic elastomer) was dissolved at a concentration of 30 mg/ml in a solvent (o-dichlorobenzene) at 140° C. and injected into a sample loop in the measuring device. The following measurement was automatically conducted under predetermined conditions. The sample solution maintained in the sample loop is injected in a volume of 0.4 ml into a TREF column (stainless steel column of 4 mm in inner diameter and 150 mm in length, charged with inert glass beads) where the components in the sample are to be fractionated depending on the temperature at which they are dissolved. The sample is cooled at a rate of 1° C./min from a temperature of 140° C. to 0° C. and coated onto the above inert carrier. In this process, polymer layers of from highly crystallizable (easily crystallizable) components to low crystallizable (hardly crystallizable) components are formed in this order on the surface of the inert carrier. The TREF column is kept at 0° C. for additional 30 minutes and then heated stepwise as shown below, and while the column was kept at each temperature for 30 minutes, the eluted fraction at each temperature was measured. Elution temperature (° C.): 0, 5, 10, 15, 20, 25, 30, 35, 40, 45, 49, 52, 55, 58, 61, 64, 67, 70, 73, 76, 79, 82, 85, 88, 91, 94, 97, 100, 102, 120, 140.

In the adhesive sheet for dicing according to the present invention, preferably the base film further includes a crystal-nucleating agent having a crystal-nucleating action on polypropylene. It was found that generation of fibrous off-cuts could be further prevented by incorporation of the crystal-nucleating agent into the base film.

In the adhesive sheet for dicing, the content of the crystal-nucleating agent is preferably 0.0001 to 1% by weight relative to the whole of the base film. The content of the crystal-nucleating agent is not particularly limited, but when the content is regulated in the range described above, the effect of the present invention is exhibited particularly usefully. The nucleating action is reduced with a decreasing amount of the crystal-nucleating agent, thus making it difficult to achieve the effect of the present invention, so the content of the nucleating agent is 0.0001% by weight or more, preferably 0.0005% by weight or more. On the other hand, the base film is made poor in flexibility with an increasing amount of the nucleating agent, thus worsening stretchability during expanding step and making pickup difficult, and thus the content of the crystal-nucleating agent is 1% by weight or less, preferably 0.1% by weight or less.

In the adhesive sheet for dicing, poly 3-methyl-1-butene can be used preferably as the crystal-nucleating agent.

In the adhesive sheet for dicing, preferably the base film is a single-layer film and contains 50% by weight or more of the olefinic thermoplastic elastomer.

In the adhesive sheet for dicing, preferably the base film is a multi-layer film and at least one layer in the multi-layer film contains 50% by weight or more of the olefinic thermoplastic elastomer.

The content of the olefinic thermoplastic elastomer in the base film is selected such that the content thereof in the mono-layer film or in at least one layer in the multi-layer film is usually 50% by weight or more, preferably 80% by weight or more, from the viewpoint of preventing generation of fibrous off-cuts. When the base film is formed as multi-layer film, a layer poor in stretchability containing the olefinic thermoplastic elastomer is arranged as at least one layer to a depth of cutting with a circular blade for full cutting, whereby generation of fibrous off-cuts during dicing can be prevented, while a layer excellent in stretch ability required for expansion is arranged as another layer, whereby the poor stretchability of the layer containing the olefinic thermoplastic elastomer can be compensated. Besides, functional layers such as a layer excellent in antistatic properties may be arranged therein to form a multi-layer film to confer additional functions such as antistatic performance.

In the adhesive sheet for dicing according to the present invention, preferably the base film further contains an ethylene series polymer containing ethylene as a major polymerization component.

In the adhesive sheet for dicing according to the present invention, the base film comprising an elastomer having a peak melting point of 120 to 170° C., among olefinic thermoplastic elastomers containing propylene and ethylene and/or α-olefin containing 4 to 8 carbon atoms as copolymerization components, and an ethylene series polymer containing ethylene as a major polymerization component, was found to be capable of preventing chipping during dicing.

In the adhesive sheet for dicing, the content of the ethylene series polymer is not particularly limited, but is preferably 5 to 50% by weight, more preferably 10 to 40% by weight relative to the olefinic thermoplastic elastomer. When the content is regulated in the range described above, the effect of the present invention is exhibited particularly effectively.

In the adhesive sheet for dicing, the ethylene series polymer is preferably high-density polyethylene with a density of 0.94 to 0.97 $g/cm^3$ and/or linear low-density polyethylene with a density of 0.91 to 0.94 g/cm³. The ethylene series polymer is not particularly limited, but is preferably the polyethylene exemplified above in order to prevent chipping.

In the adhesive sheet for dicing, preferably the base film is a single-layer film and contains 50% by weight or more in total of the olefinic thermoplastic elastomer and the ethylene series polymer.

In the adhesive sheet for dicing, preferably the base film is a multi-layer film and at least one layer in the multi-layer film contains 50% by weight or more in total of the olefinic thermoplastic elastomer and the ethylene series polymer.

The total content of the olefinic thermoplastic elastomer and the ethylene series polymer in the base film is selected such that the content thereof in the mono-layer film or in at least one layer in the multi-layer film is usually 50% by weight or more, preferably 80% by weight or more, from the viewpoint of preventing generation of fibrous off-cuts. When the base film is formed as multi-layer film, a layer containing the olefinic thermoplastic elastomer and the ethylene series polymer is arranged as at least one layer to a depth of cutting with a circular blade for full cutting, whereby chipping during dicing can be prevented, while a layer excellent in stretchability required for expansion is arranged as another layer, whereby the poor stretchability of the layer containing the olefinic thermoplastic elastomer can be compensated. Besides, functional layers such as a layer excellent in antistatic properties may be arranged therein to form a multi-layer film to confer additional functions such as antistatic performance.

The adhesive sheet for dicing is effective when the thickness of the adhesive layer is 1 to 200 μm.

To thicken the adhesive layer is not only economically disadvantageous but also causes a significant reduction in dicing quality level owing to e.g. vibration of the semiconductor wafer during dicing, and thus the thickness of the adhesive layer is preferably 1 to 200 μm, particularly preferably 3 to 50 μm. In the dicing step, the adhesive sheet for dicing is cut usually to a depth of about 5 to 230 μm with a circular blade, so when the adhesive sheet is thinner than the depth of the cut, thus permitting the base film to be cut thereby causing the problem of fibrous off-cuts from the base film, or when the influence of the chipping of the base film is problematic, the adhesive sheet for dicing according to the present invention functions effectively.

In the adhesive sheet for dicing, the adhesive layer is formed preferably from a radiation-setting adhesive.

By using the radiation-setting adhesive layer, the adhesion thereof can be lowered by irradiation with radiations so that after cutting and separation of e.g. wafers, the adhesive sheet can be easily removed from the wafers.

Further, the present invention relates to a method of dicing, comprising sticking the adhesive sheet for dicing as described above onto a material to be cut and then cutting the adhesive sheet to the depth of the base film thereby dicing the material to be cut.

As the material to be cut, a semiconductor element is effective. Further, the present invention relates to small cut pieces produced by the method of dicing as described above by dicing the material to be cut.

DESCRIPTION OF THE PREFERRED

Figure 1:
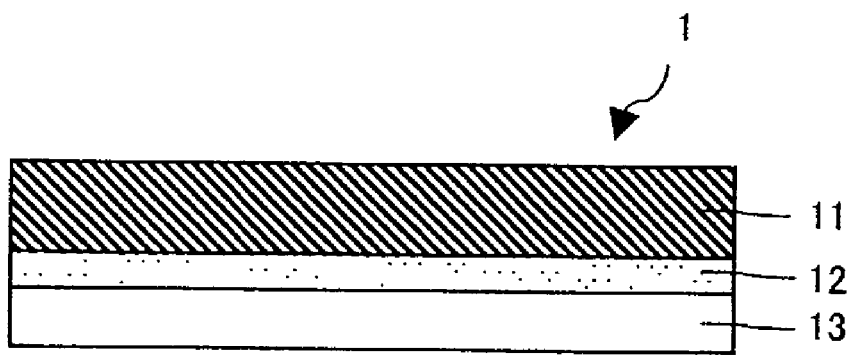
FIG. 1 is a sectional view showing one example of the adhesive sheet for dicing according to the present invention.

Hereinafter, the adhesive sheet for dicing according to the present invention is described in detail by reference to FIG. 1. As shown in FIG. 1, the adhesive sheet 1 for dicing according to the present invention is composed of a base film 11, an adhesive layer 12 arranged on at least one side of the base film 11, and if necessary a separator 13 in contact with the adhesive layer and stuck to that side of the adhesive layer not provided with the base film. In FIG. 1, the adhesive layer 12 is arranged on one side of the base film 11, but the adhesive layer may also be formed on both sides of the base film. The adhesive sheet for dicing can also be wound in the form of a tape The base film includes an olefinic thermoplastic elastomer containing propylene and ethylene and/or α-olefin containing 4 to 8 carbon atoms as polymerization components.

As a polymerization component in the olefinic thermoplastic elastomer, the α-olefin containing 4 to 8 carbon atoms includes butene-1, 3-methylpentene, 4-methylpentene-1, hexene-1, octene-1, and the like. The olefinic thermoplastic elastomer is preferably a propylene-ethylene copolymer.

The content of each polymerization component in the olefinic thermoplastic elastomer is not particularly limited insofar as the olefinic thermoplastic elastomer satisfies the requirements for peak melting temperature and temperature rising elution fractionation, but the content of propylene is usually 50 to 95% by weight, more preferably 60 to 92% by weight. Ethylene and/or α-olefin containing 4 to 8 carbon atoms are the rest of the olefinic thermoplastic elastomer excluding propylene.

The olefinic thermoplastic elastomer in the present invention contains the polymerization components described above, and satisfies the requirements for peak melting temperature and temperature rising elution fractionation. The method of producing the olefinic thermoplastic elastomer includes a method of successive polymerization comprising at least two stages wherein for example a propylene homopolymer or a random copolymer comprising propylene, a small amount of ethylene and/or α-olefin containing 4 to 8 carbon atoms is produced at a first stage and at second and subsequent stages, a random copolymer comprising propylene and ethylene and/or other α-olefin containing 4 to 8 carbon atoms is produced; and a method wherein a propylene homopolymer or a random copolymer comprising propylene, a small amount of ethylene and/or α-olefin containing 4 to 8 carbon atoms and a random copolymer comprising ethylene and α-olefin containing 4 to 8 carbon atoms or a random copolymer comprising ethylene and/or α-olefin containing 4 to 8 carbon atoms and propylene are separately polymerized and then blended with each other. In these methods, the method of successive polymerization comprising of at least two stages is preferable.

Hereinafter, the method of successive polymerization is described. The catalyst used in the successive polymerization is not particularly limited, but the catalyst preferably includes an organoaluminum compound and a solid component containing titanium atoms, magnesium atoms, halogen atoms and an electron-donating compound as essential components.

Here, the organoaluminum compound is a compound known in this kind of polymerization, which is represented by the general formula $(R^1)_m AlX_{(3-m)}$ wherein $R^1$ represents a hydrocarbon residue containing 1 to 12 carbon atoms, X represents a halogen atom, and m is an integer of 1 to 3, and examples thereof include trialkyl aluminum such as trimethyl aluminum or triethyl aluminum, dialkyl aluminum halide such as dimethyl aluminum chloride or diethyl aluminum chloride, alkyl aluminum sesquihalide such as methyl aluminum sesquichloride or ethyl aluminum sesquichloride, alkyl aluminum dihalide such as methyl aluminum dichloride or ethyl aluminum dichloride, and alkyl aluminum halide such as diethyl aluminum halide.

Further, the solid component containing titanium atoms, magnesium atoms, halogen atoms and an electron-donating compound as essential components may also be the one known in this kind of polymerization. The titanium compound as a donor of titanium atoms includes those compounds represented by the general formula $Ti(OR^2)_{4-2}X_n$ wherein $R^2$ represents a hydrocarbon residue containing 1 to 10 carbon atoms, X represents a halogen atom, and n is an integer of 1 to 4, and in particular titanium tetrachloride, tetraethoxy titanium, tetrabutoxy titanium and the like are preferable. The magnesium compound as a donor of magnesium atoms includes e.g. dialkyl magnesium, magnesium dihalide, dialkoxy magnesium, alkoxy magnesium halide and the like, among which magnesium dihalide is preferable. The halogen atoms include fluorine, chlorine, bromine and iodine among which chlorine is preferable, and these halogens are usually supplied from the titanium compound descried above, but may be supplied from other halogen donors such as aluminum halides, silicon halides and tungsten halides.

The electron-donating compound includes oxygen-containing compounds such as alcohol, phenol, ketone, aldehyde, carboxylic acid, organic acid and inorganic acid or derivatives thereof as well as nitrogen-containing compounds such as ammonia, amine, nitrile and isocyanate. The electron-donating compounds are particularly preferably inorganic acid esters, organic acid esters and organic acid halides, more preferably silicon esters, cellosolve acetates and phtalic acid halides, and most preferably those organic silicon compounds represented by the general formula $R^3 R^4_{(3-P)} Si(OR^5)_p$ wherein $R^3$ represents a branched aliphatic hydrocarbon residue containing 3 to 20 preferably 4 to 10 carbon atoms or alicyclic hydrocarbon residue containing 5 to 20 preferably, 6 to 10 carbon atoms; $R^4$ represents a branched or linear aliphatic hydrocarbon residue containing 1 to 20 preferably 1 to 10 carbon atoms; and p is an integer of 1 to 3, preferable examples including t-butyl-methyl-diethoxy silane, cyclohexyl-methyl-dimethoxy silane and cyclohexyl-methyl-diethoxy silane.

In the successive polymerization method, propylene and a small amount of ethylene and/or α-olefin containing 4 to 8 carbon atoms are fed and polymerized at the first stage in the presence of the catalyst at a temperature of 50 to 150° C., preferably 50 to 100° C. at a partial propylene pressure of 0.5 to 4.5 MPa, preferably 1 to 3.5 MPa, to produce e.g. a propylene homopolymer, and at the second stage, propylene and ethylene and/or α-olefin containing 4 to 8 carbon atoms are fed and copolymerized with the above homopolymer in the presence of the catalyst at a temperature of 50 to 150° C., preferably 50 to 100° C. at a partial pressure of 0.3 to 4.5 MPa for each of propylene and ethylene and/or α-olefin containing 4 to 8 carbon atoms, preferably 0.5 to 3.5 MPa, to produce a copolymer comprising propylene and ethylene and/or α-olefin containing 4 to 8 carbon atoms.

The polymerization can be conducted in a batch, continuous or semi-batch system, and the polymerization at the first stage is conducted in a gaseous or liquid phase, and the polymerization at the second stage is also conducted in a gaseous or liquid phase, particularly preferably in a gaseous phase. The retention time at each stage is 0.5 to 10 hours, preferably 1 to 5 hours.

If powders or particles of the olefinic thermoplastic elastomer produced by the method described above have a problem such as stickiness and the like, an active hydrogen-containing compound is preferably added after polymerization at the first stage and before or during polymerization at the second stage in the range of 100 to 1000 times moles of the titanium atom in the solid component in the catalyst and simultaneously in the range of 2 to 5 times moles of the organoaluminum compound in the catalyst. The active hydrogen-containing compound includes e.g. water, alcohol, phenol, aldehyde, carboxylic acid, acid amide, ammonia, amines and the like.

The olefin type thermoplastic elastomer produced by the method described above has a melt flow rate (MFR) of 0.1 to 50 g/10 min as determined at a temperature of 230° C. under a loading of 21.18 N in accordance with JIS K7210, a density of about 0.87 to 0.89 g/cm³ as determined by a method of replacement in water in accordance with JIS K7112, and a stiffness modulus of 600 MPa or less as determined at a temperature of 23° C. in accordance with JIS K7203.

The olefinic thermoplastic elastomer can also be dynamically heat-treated in the presence of a known organic peroxide and if necessary a crosslinking agent containing one or more, preferably two or more double bonds in the molecule, whereby the MFR can be regulated.

The base film in the present invention may contain the above-described olefinic thermoplastic elastomer as constituent resin, and may be composed of the olefinic thermoplastic elastomer alone or a mixture thereof with other plastic resins or elastomers if necessary. Preferably used plastic resins or elastomers include conventional plastics or elastomer sheet resins for example known polyolefins such as polypropylene, polyethylene and polybutene as well as polyethylene terephthalate, polyvinyl chloride, polyurethane, polystyrene, styrene type elastomer, and ethylene-propylene rubber or ethylene-α-olefin copolymers (rubber) comprising ethylene and propylene and/or α-olefin containing 4 to 8 carbon atoms. As described above, the content of the olefinic thermoplastic elastomer in the base film is usually 50% by weight or more, preferably 80% by weight or more, for the effect of preventing generation of fibrous off-cuts.

When the influence of chipping of the base film is problematic, the base film is composed preferably of a mixture of the olefinic thermoplastic elastomer and a polymer containing ethylene as a major polymerization component.

As the ethylene series polymer mixed with the olefinic thermoplastic elastomer, a polymer containing at least 50 mol-% ethylene as a polymerization component can be used without any particular limitation.

The ethylene series polymer includes e.g. high-pressure low-density polyethylene with a density of 0.91 to 0.94 g/cm³; high-density polyethylene with a density of 0.94 to 0.97 g/cm³; linear low-density polyethylene with a density of 0.91 to 0.94 g/cm³; a metallocene type ethylene-α-olefin copolymer with a density of 0.88 to 0.91 g/cm³, for example a copolymer of α-olefin containing 3 to 8 carbon atoms such as propylene, 1-butene, 1-hexene or 1-octene; and ethylene-α-olefin copolymer rubber with a density of 0.85 to 0.88 g/cm³. The method of producing these ethylene series polymers is not particularly limited, but these polymers are produced for example by a high-pressure radical polymerization method or by a coordination anion polymerization method using a Ziegler type catalyst or a single-site catalyst such as a metallocene type catalyst. The ethylene series polymer includes e.g. an ethylene-vinyl acetate copolymer (EVA), a copolymer of ethylene and methacrylic acid and/or methacrylate, a copolymer of ethylene and acrylic acid and/or acrylate, a copolymer (ionomer) of ethylene and metal methacrylate and/or metal acrylate, an ethylene-propylene-non-conjugated diene copolymer rubber (EPDM), an ethylene-styrene copolymer, an ethylene-norbornane copolymer and the like. Among these ethylene series polymers, high-density polyethylene with a density of 0.94 to 0.97 g/cm$^3$ and/or linear low-density polyethylene with a density of 0.91 to 0.94 g/cm$^3$ are preferable. In particular, high-density polyethylene with a density of 0.94 to 0.97 g/cm$^3$ is preferable.

The ratio of the ethylene series polymer to the olefinic thermoplastic elastomer is preferably 5 to 50% by weight as described above. The method of mixing the olefinic thermoplastic elastomer with the ethylene series polymer is not particularly limited, but for example, a method of melt-kneading by a Banbury mixer, a single-screw extruder or a twin-screw extruder and a method of mixing (dry blending) them during production of the film can be mentioned. In particular, the method of melt-kneading is preferable. During melt-kneading, the olefinic thermoplastic elastomer and the ethylene series polymer can also be dynamically heat-treated in the presence of a known organic peroxide or a crosslinking agent containing one or more, preferably two or more double bonds in the molecule.

The total amount of the olefinic thermoplastic elastomer and the ethylene series polymer in the base film is usually 50% by weight or more, preferably 80% by weight or more, for the effect of preventing chipping.

The base film can be blended if necessary with softeners such as mineral oil, fillers such as calcium carbonate, silica, talc, mica and clay, and various additives such as antioxidants, optical stabilizers, antistatic agents, lubricants, dispersants, neutralizing agents, α-crystal-nucleating agents and β-crystal-nucleating agents.

Among these additives, the crystal-nucleating agent having a crystal-nucleating action on polypropylene is preferably contained as an additive in the base film in this invention. The content of the crystal-nucleating agent in the base film is preferably 0.0001 to 1% by weight.

The crystal-nucleating agent is not particularly limited, and examples thereof include various inorganic compounds, various carboxylic acids or metal salts thereof, dibenzylidene sorbitol type compounds, aryl phosphate type compounds, mixtures of cyclic polyvalent metal aryl phosphate type compounds and alkali metal fatty monocarboxylates or basic aluminum.lithium.hydroxy.carbonate.hydrate, and α-crystal-nucleating agents such as various polymeric compounds. These crystal-nucleating agents can be used singly or as a mixture thereof.

Examples of the inorganic compounds include talc, alum, silica, titanium oxide, calcium oxide, magnesium oxide, carbon black, clay minerals, and the like.

Examples of the carboxylic acids include carboxylic acids excluding fatty monocarboxylic acids. Examples there of include malonic acid, succinic acid, adipic acid, maleic acid, azelaic acid, sebacic acid, dodecane diacid, citric acid, butane tricarboxylic acid, butane tetracarboxylic acid, naphthenic acid, cyclopentane carboxylic acid, 1-methylcyclopentane carboxylic acid, 2-methylcyclopentane carboxylic acid, cyclopentene carboxylic acid, cyclohexane carboxylic acid, 1-methylcyclohexane carboxylic acid, 4-methylcyclohexane carboxylic acid, 3,5-dimethylcyclohexane carboxylic acid, 4-butylcyclohexane carboxylic acid, 4-octylcyclohexane carboxylic acid, cyclohexene carboxylic acid, 4-cyclohexene-1,2-dicarboxylic acid, benzoic acid, toluic acid, xylylic acid, ethylbenzoic acid, 4-t-butylbenzoic acid, salicylic acid, phthalic acid, trimellitic acid and pyromellitic acid. As metals salts of these carboxylic acids, normal salts or basic salts there of with lithium, sodium, potassium, magnesium, calcium, strontium, barium, zinc or aluminum can be mentioned.

The dibenzylidene sorbitol type compound includes e.g.
1.3,2.4-dibenzylidene sorbitol,
1.3-benzylidene-2.4-p-methylbenzylidene sorbitol,
1.3-benzylidene-2.4-p-ethylbenzylidene sorbitol,
1.3-p-methylbenzylidene-2.4-benzylidene sorbitol,
1.3-p-ethylbenzylidene-2.4-p-benzylidene sorbitol,
1.3-p-methylbenzylidene-2.4-p-ethylbenzylidene sorbitol,
1.3-p-ethylbenzylidene-2.4-p-methylbenzylidene sorbitol,
1.3,2.4-bis(p-methylbenzylidene) sorbitol,
1.3,2.4-bis(p-ethylbenzylidene) sorbitol,
1.3,2.4-bis(p-n-propylbenzylidene) sorbitol,
1.3,2.4-bis(p-i-propylbenzylidene) sorbitol,
1.3,2.4-bis(p-n-butylbenzylidene) sorbitol,
1.3,2.4-bis(p-s-butylbenzylidene) sorbitol,
1.3,2.4-bis(p-t-butylbenzylidene) sorbitol,
1.3-(2'.4'-dimethylbenzylidene)-2.4-benzylidene sorbitol,
1.3-benzylidene-2.4-(2'.4'-dimethylbenzylidene) sorbitol,
1.3,2.4-bis(2',4'-dimethylbenzylidene) sorbitol,
1.3,2.4-bis(3',4'-dimethylbenzylidene) sorbitol,
1.3,2.4-bis(p-methoybenzylidene) sorbitol,
1.3,2.4-bis(p-ethoxybenzylidene) sorbitol,
1.3-benzylidene-2.4-p-chlorobenzylidene sorbitol,
1.3-p-chlorobenzylidene-2.4-benzylidene sorbitol,
1.3-p-chlorobenzylidene-2.4-p-methylbenzylidene sorbitol,
1.3-p-chlorobenzylidene-2.4-p-ethylbenzylidene sorbitol,
1.3-p-methylbenzylidene-2.4-p-chlorobenzylidene sorbitol,
1.3-p-ethylbenzylidene-2.4-p-chlorobenzylidene sorbitol and
1.3,2.4-bis(p-chlorobenzylidene) sorbitol.

The aryl phosphate type compound includes e.g. lithium bis(4-t-butylphenyl)phosphate, sodium bis(4-t-butylphenyl)phosphate, lithium bis(4-cumylphenyl)phosphate, sodium bis(4-cumylphenyl)phosphate, potassium bis(4-t-butylphenyl)phosphate, calcium mono(4-t-butylphenyl)phosphate, calcium bis(4-t-butylphenyl)phosphate, magnesium mono(4-t-butylphenyl)phosphate, magnesium bis(4-t-butylphenyl)phosphate, zinc mono(4-t-butylphenyl)phosphate, zinc bis(4-t-butylphenyl)phosphate, aluminum dihydroxy-(4-t-butylphenyl)phosphate, aluminum hydroxy-bis(4-t-butylphenyl)phosphate, aluminum tris(4-t-butylphenyl)phosphate, sodium 2,2'-methylene-bis(4,6-di-t-butylphenyl)phosphate, sodium 2,2'-ethylidene-bis(4,6-di-t-butylphenyl)phosphate, sodium 2,2'-methylene-bis(4-cumyl-6-t-butylphenyl)phosphate, lithium 2,2'-methylene-bis(4,6-di-t-butylphenyl)phosphate, lithium 2,2'-ethylidene-bis(4,6-di-t-butylphenyl)phosphate, lithium 2,2'-methylene-bis(4-cumyl-6-t-butylphenyl)phosphate, sodium 2,2'-ethylidene-bis(4-i-propyl-6-t-butylphenyl)phosphate, lithium 2,2'-methylene-bis(4-methyl-6-t-butylphenyl)phosphate, lithium 2,2'-methylene-bis(4-ethyl-6-t-butylphenyl)phosphate, sodium 2,2'-butylidene-bis(4,6-di-methylphenyl)phosphate,
sodium 2,2'-butylidene-bis(4,6-di-t-butylphenyl)phosphate,
sodium 2,2'-t-octylmethylene-bis(4,6-di-methylphenyl)phosphate,
sodium 2,2'-t-octylmethylene-bis(4,6-di-t-butylphenyl)phosphate,
sodium 2,2'-methylene-bis(4-methyl-6-t-butylphenyl)phosphate,
sodium 2,2'-methylene-bis(4-ethyl-6-t-butylphenyl)phosphate, sodium (4,4'-dimethyl-6,6'-di-t-butyl-2,2'-biphenyl)phosphate,
sodium 2,2'-ethylidene-bis(4-s-butyl-6-t-butylphenyl)phosphate,
sodium 2,2'-methylene-bis(4,6-di-methylphenyl)phosphate,
sodium 2,2'-methylene-bis(4,6-di-ethylphenyl)phosphate,
potassium 2,2'-ethylidene-bis(4,6-di-butylphenyl)phosphate, calcium bis[2,2'-methylene-bis(4,6-di-t-butylphenyl)phosphate],
magnesium bis[2,2'-methylene-bis(4,6-di-t-butylphenyl)phosphate],
zinc bis[2,2'-methylene-bis(4,6-di-t-butylphenyl)phosphate], aluminum tris[2,2'-methylene-bis(4,6-di-t-butylphenyl)phosphate],
calcium bis[2,2'-methylene-bis(4-methyl-6-t-butylphenyl)phosphate], calcium
bis[2,2'-ethylidene-bis(4,6-di-t-butylphenyl)phosphate], calcium
bis[2,2'-thiobis(4-methyl-6-t-butylphenyl)phosphate], calcium bis[2,2'-thiobis(4-ethyl-6-t-butylphenyl)phosphate],
calcium bis[2,2'-thiobis(4,6-di-t-butylphenyl)phosphate],
magnesium bis[2,2'-thiobis(4,6-di-t-butylphenyl)phosphate],
magnesium bis[2,2'-thiobis(4-t-octylphenyl)phosphate], barium
bis[2,2'-methylene-bis(4,6-di-t-butylphenyl)phosphate], calcium
bis[(4,4'-dimethyl-6,6'-di-t-butyl-2,2'-biphenyl)phosphate], magnesium
bis[2,2'-ethylidene-bis(4,6-di-t-butylphenyl)phosphate], barium
bis[2,2'-ethylidene-bis(4,6-di-t-butylphenyl)phosphate], aluminum
tris[2,2'-ethylidene-bis(4,6-di-t-butylphenyl)phosphate], aluminum
dihydroxy-2,2'-methylene-bis(4,6-di-t-butylphenyl)phosphate, aluminum
dihydroxy-2,2'-methylene-bis(4-cumyl-6-t-butylphenyl) phosph ate, aluminum
hydroxy-bis[2,2'-methylene-bis(4,6-di-t-butylphenyl)phospha te], aluminum
hydroxy-bis[2,2'-methylene-bis(4-cumyl-6-t-butylphenyl) phos phate], titanium
dihydroxy-bis[2,2'-methylene-bis(4,6-di-t-butylphenyl) phosp hate], tin
dihydroxy-bis[2,2'-methylene-bis(4,6-di-t-butylphenyl) phosp hate], zirconium
oxy-bis[2,2'-methylene-bis(4,6-di-t-butylphenyl)phosphate], aluminum
dihydroxy-2,2'-methylene-bis(4-methyl-6-t-butylphenyl) phosp hate, aluminum
hydroxy-bis[2,2'-methylene-bis(4-methyl-6-t-butylphenyl) phosphate], aluminum
dihydroxy-2,2'-ethylidene-bis(4,6-di-t-butylphenyl) phosphate, and aluminum
hydroxy-bis[2,2'-ethylidene-bis(4,6-di-t-butylphenyl)phosphate].

The alkali metal salts of fatty monocarboxylic acids used as a mixture with the cyclic polyvalent aryl phosphate type compound out of the aryl phosphate type compounds described above include lithium, sodium or potassium salts of acetic acid, lactic acid, propionic acid, acrylic acid, octylic acid, isooctylic acid, nonanoic acid, decanoic acid, lauric acid, myristic acid, palmitic acid, stearic acid, oleic acid, linolic acid, linoleic acid, 12-hydroxystearic acid, ricinoleic acid, behenic acid, erucic acid, montanic acid, melissic acid, stearoyllactic acid, β-dodecylmercaptoacetic acid, β-dodecylmercaptopropionic acid, β-N-laurylaminopropionic acid and β-N-methyl-N-lauroylaminopropionic acid.

The polymeric compound includes e.g. polyethylene, poly 3-methyl-1-butene, poly 3-methyl-1-pentene, poly 3-ethyl-1-pentene, poly 4-methyl-1-pentene, poly 4-methyl-1-hexene, poly 4,4-dimethyl-1-pentene, poly 4,4-dimethyl-1-hexene, poly 4-ethyl-1-hexene, poly 3-ethyl-1-hexene, polyallylnaphthalene, polyallylnorbornane, atactic polystyrene, syndiotactic polystyrene, poly dimethylstyrene, poly vinylnaphthalene, poly allylbenzene, poly allyltoluene, poly vinylcyclopentane, poly vinylcyclohexane, poly vinylcycloheptane, poly vinyltrimethylsilane and poly allyltrimethylsilane.

These polymeric compounds can be obtained as propylene polymers containing the above polymeric compounds at a concentration of about 0.01 to 0.15% by weight by a method as shown in e.g. Japanese Patent Application Laid-Open No.43204 (1990) wherein 0.01 to 100 g monomers to constitute the polymeric compounds are preliminarily polymerized and then polymerized with propylene only or copolymerized with propylene and a small amount of ethylene and/or α-olefin. By adding the resultant product to the olefinic thermoplastic elastomer, the polymeric compound as a crystal-nucleating agent can be mixed efficiently and uniformly with the olefinic thermoplastic elastomer, to achieve an excellent crystal-nucleating action in a very small amount.

When the crystal-nucleating agent is a low-molecular compound, the adhesion between the base material and the adhesive layer is lowered and semiconductors are contaminated with metal ions, so the crystal-nucleating agent used in the present invention is preferably a high-molecular compound. Among the polymeric compounds, poly 3-methyl-1-butene is preferable.

The base film in the present invention can be produced by conventional techniques such as extrusion, and the thickness thereof is usually about 10 to 300 μm, preferably about 30 to 200 μm. The base film may be either a single- or multi-layer film, but a layer ranging from the surface in contact with the adhesive layer to a depth of about 150 μm where a circular blade will reach during dicing is preferably a layer containing the olefinic thermoplastic elastomer. The multi-layer film can be produced for example by conventional film lamination such as co-extrusion or dry lamination using the above polyolefin etc. in other layers.

The resultant base film may be subjected if necessary to mono- or biaxial stretching. Stretching is conducted preferably at about 60 to 100° C. The base film thus prepared may be subjected if necessary to conventional physical or chemical treatment by matting, corona discharge, a primer, and the like.

The adhesive layer can make use of known or conventional adhesives. Such adhesives are not particularly limited, and various kinds of adhesives such as those based on rubber series, acryl series, silicone series or poly vinylethers series and the likes are used.

The adhesives are preferably acrylic series adhesives. Acrylic polymers used as the base polymer in the acrylic series adhesives are usually polymers of alkyl (meth) acrylate or copolymers thereof with copolymerization monomers. The main monomer in the acrylic polymer is preferably an alkyl (meth) acrylate giving a homopolymer having a glass transition temperature of 20° C. or less.

The alkyl moiety in the alkyl (meth) acrylate includes e.g. A methyl group, ethyl group, butyl group, 2-ethylhexyl group, octyl group, isononyl group, and the like. The copolymerization monomers include hydroxy alkyl ester of (meth) acrylates (for example, hydroxy ethyl ester, hydroxy butyl ester, hydroxy hexyl ester, and the like.), glycidyl (meth) acrylate ester, (meth)acrylic acid, itaconic acid, maleic anhydride, (meth)acrylic acid amide, (meth)acrylic acid N-hydroxymethylamide, alkylaminoalkyl (meth)acrylates (for example, dimethylaminoethyl methacrylate, t-butylaminoethyl methacrylate etc.), vinyl acetate, styrene, acrylonitrile, and the like.

The adhesive used may be a radiation-setting adhesive to be set by UV rays, electron rays, and the like or a thermally foaming adhesive. Further, an adhesive also capable of serving as a dicing die bond may be used. In the present invention, a radiation-setting adhesive, particularly a UV setting adhesive is preferably used. When the adhesive used is a radiation-setting adhesive, the adhesive will be irradiated with radiations before or after the dicing step, so the base film preferably has sufficient radiation permeability.

The radiation-setting adhesive includes e.g. the above base polymer (acrylic polymer) and a radiation-setting component. The radiation-setting component may be any of such components as monomers, oligomers or polymers having carbon-carbon double bonds in the molecule and capable of setting by radical polymerization. The radiation-setting component includes e.g. esters between polyvalent alcohol and (meth) acrylic acid, such as trimethylol propane tri (meth) acrylate, pentaerythritol tri (meth) acrylate, tetraethylene glycol di (meth) acrylate, 1,6-hexane diol di (meth) acrylate, neopentyl glycol di (meth) acrylate and dipentaerythritol hexa (meth) acrylate; acrylate oligomers; and isocyanurates or isocyanurate compounds such as 2-propenyl-di-3-butenyl cyanurate, 2-hydroxyethyl bis (2-acryloxy-ethyl) isocyanurate and tris (2-methacryloxyethyl) isocyanurate.

Further, the base polymer (acrylic polymer) used in the radiation-setting adhesive may be a radiation-setting polymer having carbon-carbon double bonds in side chains of the polymer, and in this case, addition of the radiation-setting component described above is not necessary.

For setting the radiation-setting adhesive by UV rays, a photopolymerization initiator is necessary. The polymerization initiator includes e.g. benzoin alkyl ethers such as benzoyl methyl ether, benzoin propyl ether and benzoin isobutyl ether; aromatic ketones such as benzyl, benzoin, benzophenone and α-hydroxycyclohexyl phenyl ketone; aromatic ketals such as benzyl dimethyl ketal; polyvinyl benzophenone; and thioxanthones such as chlorothioxanthone, dodecyl thioxanthone, dimethyl thioxanthone and diethyl thioxanthone.

If necessary, the adhesive can also contain conventional additives such as a crosslinking agent, a tackifire, a filler, an aging inhibitor and a coloring agent. The crosslinking agent includes e.g. polyisocyanate compounds, melamine resin, urea resin, aziridine compounds, epoxy resin, anhydrides, polyamine and carboxyl group-containing polymers.

The adhesive sheet 1 for dicing according to the present invention can be produced for example by applying an adhesive onto the surface of a base film 11, drying the adhesive (if necessary thermally crosslinking it) to form an adhesive layer 12 and then sticking a separator 13 if necessary to the surface of the adhesive layer 12. Alternatively, a method of separately forming the adhesive layer 12 on the separator 13 and then sticking them to the base film 11 can also be used.

The thickness of the adhesive layer can be determined suitably depending on the type of the adhesive or the depth of a cut by dicing, but is usually about 1 to 200 μm, preferably about 3 to 50 μm.

For the purpose of labeling or smoothing the adhesive layer, a separator may be arranged if necessary. The material constituting the separator includes synthetic resin film such as paper, polyethylene, polypropylene, polyethylene terephthalate etc. To improve releasability from the adhesive layer, the surface of the separator maybe subjected if necessary to treatment with silicone, long-chain alkyl, fluorine compound etc. For the purpose of improving toughness, the separator may be subjected to monoaxial or biaxial stretching or laminated on another plastic film. The thickness of the separator is usually about 10 to 200 μm, preferably about 25 to 100 μm.

EXAMPLES

Hereinafter, the present invention is described in more detail by reference to the Examples, which are not intended to limit the present invention.

Example 1

(Preparation of a Base Film)

Zelas 5053 (trade name) produced by MITSUBISHI CHEMICAL CORPORATION was fed to a T-die molding machine (set at a temperature of 230° C.) manufactured by Plako Co., Ltd. to prepare a base film of 100 μm in thickness and 29 cm in width.

Zelas 5053 (trade name) produced by MITSUBISHI CHEMICAL CORPORATION is an olefinic thermoplastic elastomer consisting of 79% by weight propylene component and 21% by weight ethylene component, and the ratio of an eluted fraction of this commercial product at 0° C. to total eluted fractions thereof in temperature rising elution fractionation at temperatures ranging from 0 to 140° C. in o-dichlorobenzene as the solvent is 41.7% by weight, the peak melting temperature is 164° C., the density is 0.88 g/cm$^3$, and the MFR (230° C., 21.18 N) is 6.8 g/10 minutes.

(Preparation of an Adhesive)

60 parts by weight of dipentaerythritol hexa-acrylate (Kayarad DPHA (trade name), Nippon Kayaku Co., Ltd.), 3 parts by weight of a photopolymerization initiator (Irgacure 184 (trade name), Ciba Specialty Chemicals) and 5 parts by weight of a polyisocyanate compound Colonate L (trade name), Nippon Urethane Co., Ltd.) were added to a solution containing an acrylic copolymer with a weight-average molecular weight of 500,000 obtained in a usual manner by copolymerizing 95 parts by weight of butyl acrylate with 5 parts by weight of acrylic acid in toluene, whereby a solution of an acrylic UV-setting adhesive was prepared.

(Preparation of an Adhesive Sheet for Dicing)

The adhesive solution prepared above was applied onto a corona-treated surface of the base film obtained above and thermally crosslinked at 80° C. for 10 minutes to form a UV-setting adhesive layer of 20 μm in thickness thereon. Then, a separator was stuck to the surface of the adhesive layer to prepare a UV-setting adhesive sheet for dicing.

Example 2

Zelas 5053 (trade name, MITSUBISHI CHEMICAL CORPORATION) used in Example 1 and Kernel KF261 (Nippon Polychem Co., Ltd.) were fed at a ratio of 80:20 (ratio by weight) to a twin-screw kneader (PCM-45, cylinder diameter 45 mm, L/D=34, set at a temperature of 200° C., Ikegai Co., Ltd.), and melt-kneaded into pellets and then formed into a film in the same manner as in Example 1, whereby a base film was obtained.

Kernel KF261 produced by Nippon Polychem Co., Ltd. is metallocene-based low-density polyethylene with a density of 0.898 $g/cm^3$ and an MFR (190° C., 21.18 N) of 2.2 g/10 min.

(Preparation of an Adhesive Sheet for Dicing)

The adhesive solution prepared in Example 1 was applied onto a corona-treated surface of the base film obtained above and thermally crosslinked at 80° C. for 10 minutes to form a UV-setting adhesive layer of 50 μm in thickness thereon. Then, a separator was stuck to the surface of the adhesive layer, whereby a UV-setting adhesive sheet for dicing was prepared.

Example 3

(Preparation of a Base Film)

Zelas 5053 (trade name, MITSUBISHI CHEMICAL CORPORATION), and a propylene homopolymer having an MFR (230° C., 21.18 N) of 4.8 g/10 min. into which 0.08% by weight poly 3-methyl-1-butene had been introduced in preliminary polymerization, were fed at a ratio of 100:1 (ratio by weight) to a twin-screw kneader (PCM-45, cylinder diameter 45 mm, L/D=34, set at a temperature of 200° C., Ikegai Co., Ltd.) and melt-kneaded into pellets. Then, the pellets were fed to a T-die molding machine (temperature set at 230° C.) manufactured by Plako Co., Ltd. to prepare a base film of 100 μm in thickness and 29 cm in width. The content of the crystal-nucleating agent (poly 3-methyl-1-butene) in the base film thus prepared was 0.00079% by weight.

(Preparation of an Adhesive)

60 parts by weight of dipentaerythritol hexa-acrylate (Kayarad DPHA, Nippon Kayaku Co., Ltd.), 3 parts by weight of a photopolymerization initiator (Irgacure 184 (trade name), Ciba Specialty Chemicals) and 5 parts by weight of a polyisocyanate compound (Colonate L (trade name), Nippon Urethane Co., Ltd.) were added to a solution containing an acrylic copolymer with a weight-average molecular weight of 500,000 obtained in a usual manner by copolymerizing 90 parts by weight of butyl acrylate with 10 parts by weight of acrylic acid in toluene, whereby a solution of an acrylic UV-setting adhesive was prepared.

(Preparation of an Adhesive Sheet for Dicing)

The adhesive solution prepared above was applied onto a corona-treated surface of the base film obtained above and thermally crosslinked at 80° C. for 10 minutes to form a UV-setting adhesive layer of 20 μm in thickness thereon. Then, a separator was stuck to the surface of the adhesive layer to prepare a UV-setting adhesive sheet for dicing.

Example 4

(Preparation of a Base Film)

Zelas 5053 (trade name, MITSUBISHI CHEMICAL CORPORATION) used in Example 1, Novateck HD HB330 (trade name, Nippon Polychem Co., Ltd.), and a propylene homopolymer having an MFR (230° C., 21.18 N) of 4.8 g/10 min. into which 0.08% by weight poly 3-methyl-1-butene had been introduced in preliminary polymerization were fed at a ratio of 80:20:1 (ratio by weight) to a twin-screw kneader (PCM-45, cylinder diameter 45 mm, L/D=34, set at a temperature of 200° C., Ikegai Co., Ltd.) and melt-kneaded into pellets, which were then formed into a base sheet in the same manner as in Example 3. The content of the crystal-nucleating agent (poly 3-methyl-1-butene) in the base film thus prepared was 0.00079% by weight.

Novateck HD HB330 produced by Nippon Polychem Co., Ltd. js high-density polyethylene with a density of 0.953 $g/cm$ and an MFR (190° C., 21.18 N) of 0.35 g/10 min.

(Preparation of an Adhesive Sheet for Dicing)

The adhesive solution prepared in Example 3 was applied onto a corona-treated surface of the base film obtained above and thermally crosslinked at 80° C. for 10 minutes to form a UV-setting adhesive layer of 50 μm in thickness thereon. Then, a separator was stuck to the surface of the adhesive layer to prepare a UV-setting adhesive sheet for dicing.

Comparative Example 1

An adhesive sheet for dicing was prepared in the same manner as in Example 1 except that the used base film was a film of 100 μm in thickness produced by T-die extrusion of low-density polyethylene. The peak melting temperature of the low-density polyethylene is 110° C., the density is 0.923 $g/cm^2$, and the MFR (190° C., 21.18 N) is 1.5 g/10 min.

Comparative Example 2

An adhesive sheet for dicing was prepared in the same manner as in Example 1 except that the used base film was a film of 100 μm in thickness produced by T-die extrusion of an ethylene-methacrylic acid copolymer. The peak melting temperature of the ethylene-methacrylic acid copolymer is 100° C., the density is 0.930 $g/cm^2$, and the MFR (190° C., 21.18 N) is 3 g/10 min.

Comparative Example 3

A UV-setting adhesive sheet for dicing was prepared in the same manner as in Example 1 except that the used base film was a base film of 100 μm in thickness produced by T-die extrusion of an ethylene-methacrylic acid copolymer (MFR=2.0) followed by subjecting one surface of the resultant film to corona treatment.

(Evaluation Test)

The adhesive sheets for dicing obtained in the Examples and Comparative Examples were evaluated in the method described below. The results are shown in Table 1.

(1) Evaluation of Dicing Performance

A six-inch wafer of 350 μm in thickness was mounted on the adhesive sheet for dicing and then diced under the following conditions.

(Dicing Conditions)
Dicer: DFD-651, DISCO Co., Ltd.
Blade: NBC-ZH205O 27HEDD, DISCO Co., Ltd.
Number of revolutions of the blade: 45,000 rpm.
Dicing rate: 100 mm/sec.

Dicing depth: To a depth of 30 μm in the base film.
Dicing size: 2.5 mm×2.5 mm.
Cut mode: Down cut.

After dicing, occurrence of fibrous off-cuts on the surfaces of the cut chips was observed under an optical microscope (×200), and the number of fibrous off-cuts of size in a predetermined range was counted.

TABLE 1

| | Number of fibrous off-cuts of size (μm) in a predetermined range | | |
|---|---|---|---|
| | less than 100 μm | 100 to 500 μm | 500 μm or more |
| Example 1 | 51 | 0 | 0 |
| Example 2 | 13 | 0 | 0 |
| Example 3 | 0 | 0 | 0 |
| Example 4 | 0 | 0 | 0 |
| Comparative Example 1 | 100 or more | 100 or more | 100 or more |
| Comparative Example 2 | 100 or more | 100 or more | 67 |
| Comparative Example 3 | 100 or more | 100 or more | 67 |

As can be seen from Table 1, the adhesive sheets for dicing in the Examples indicate less generation of fibrous off-cuts. These adhesive sheets do not indicate generation of fibrous off-cut of 100 μm or more in size. Particularly, the adhesive sheets for dicing in Examples 3 and 4 using a base film containing a crystal-nucleating agent can be seen to cause less generation fibrous off-cuts. The wafers in the Examples and Comparative Examples did not show a reduction in quality level.

Example 5

(Preparation of a Base Film)
Zelas 5053 (trade name, MITSUBISHI CHEMICAL CORPORATION) and Novateck HD HB330 (trade name, Nippon Polychem Co., Ltd.) were fed at a ratio of 80:20 (ratio by weight) to a twin-screw kneader (PCM-45, cylinder diameter 45 mm, L/D=34, set at a temperature of 200° C., Ikegai Co., Ltd.) and melt-kneaded into pellets. The pellets were then fed to a T-die molding machine (set at a temperature of 230° C.) manufactured by Plako Co., Ltd. to prepare a base film of 100 μm in thickness and 29 cm in width.

(Preparation of an Adhesive Sheet for Dicing)
The adhesive solution prepared in Example 3 was applied onto a corona-treated surface of the base film obtained above and thermally crosslinked at 80° C. for 10 minutes to form a UV-setting adhesive layer of 5 μm in thickness thereon. Then, a separator was stuck to the surface of the adhesive layer to prepare a UV-setting adhesive sheet for dicing.

Example 6

(Preparation of a Base Film)
Zelas 5053 (trade name, MITSUBISHI CHEMICAL CORPORATION) and Novateck LL UF420 (trade name, Nippon Polychem Co., Ltd.) were fed at a ratio of 80:20 (ratio by weight) to a twin-screw kneader (PCM-45, cylinder diameter 45 mm, L/D=34, set at a temperature of 200° C., Ikegai Co., Ltd.) and melt-kneaded into pellets. Using the pellets, a base film was obtained in the same manner as in Example 5.

Novateck LL UF420 produced by Nippon Polychem Co., Ltd. is linear low-density polyethylene with a density of 0.925 g/cm$^3$ and an MFR (190° C., 21.18 N) of 0.8 g/10 min.

(Preparation of an Adhesive Sheet for Dicing)
The adhesive solution prepared in Example 3 was applied onto a corona-treated surface of the base film obtained above and thermally crosslinked at 80° C. for 10 minutes to form a UV-setting adhesive layer of 20 μm in thickness thereon. Then, a separator was stuck to the surface of the adhesive layer to prepare a UV-setting adhesive sheet for dicing.

Comparative Example 4

In production of the adhesive-baked sheet for dicing in Example 5, an adhesive sheet was prepared in the same manner as in Example 1 except that the used base film was a base film of 80 μm in thickness produced by dry-blending 50 parts by weight of polypropylene (Novateck FL6CK, produced by Nippon Polychem Co., Ltd.) with 50 parts by weight of an ethylene-methyl methacrylate copolymer (Aqulift WM305, Sumitomo Chemical Co., Ltd.) and then extruding the blend into a base film.

Comparative Example 5

In production of the adhesive-baked sheet for dicing in Example 5, an adhesive sheet was prepared in the same manner as in Example 1 except that the used base film was a linear low-density polyethylene film of 80 μm in thickness.

(Evaluation Test)
The adhesive sheets for dicing obtained in the Examples and Comparative Examples were evaluated in the following method. The results are shown in Table 2.

(Chipping Evaluation)
A six-inch wafer of 150 μm in thickness whose back was subjected to back-grinding (#2000 finish) was mounted on each of the adhesive sheets for dicing obtained in the Examples and Comparative Examples, and each sheet was diced under the conditions described below. After dicing, the back of the sheet was irradiated with UV rays (500 mJ/cm$^2$), and then 50 arbitrary semiconductor chips were picked up (released) therefrom. The depth, in the chip depth direction, of each chipping at the side of the resultant semiconductor was observed under an optical microscope (×200), and the number of chippings of size in a predetermined range was counted.

(Yield)
The yield was expressed in terms of the ratio of semiconductor chips having a chipping size of 50 μm or less to the 50 arbitrary semiconductor chips evaluated for chippings.

(Dicing Conditions)
Dicer: DFD-651, DISCO Co., Ltd.
Blade: NBC-ZH205O 27HEDD, DISCO Co., Ltd.
Number of revolutions of the blade: 40000 rpm.
Dicing rate: 120 mm/sec.
Dicing depth: To a depth of 30 μm in the base film.
Dicing size: 2.5 mm×2.5 mm.
Cut mode: Down cut.

TABLE 2

| | Count of chippings (number) | | | | | Yield |
|---|---|---|---|---|---|---|
| | Chipping size | | | | | |
| | 25 μm - | 50 μm - | 75 μm - | 100 μm - | Total | (%) |
| Example 5 | 5 | 0 | 0 | 0 | 5 | 100 |
| Example 6 | 8 | 1 | 0 | 0 | 9 | 98 |

TABLE 2-continued

| | Count of chippings (number) | | | | | Yield (%) |
|---|---|---|---|---|---|---|
| | Chipping size | | | | | |
| | 25 μm - | 50 μm - | 75 μm - | 100 μm - | Total | |
| Comparative Example 4 | 8 | 5 | 3 | 1 | 17 | 82 |
| Comparative Example 5 | 2 | 2 | 3 | 10 | 17 | 70 |

As can be seen from Table 2, the adhesive sheets for dicing in Examples 5 and 6 show a very small number of chippings having a chipping size of 50 μm or more, indicating good yield. On the other hand, in Comparative Examples 4 and 5, generation of chippings having a chipping size of 50 μm or more is significant, indicating poor yield.

What is claimed is:

1. A dicing sheet configured to be attached to a material-to-be-cut for dicing, comprising a base film provided at least one surface thereof with an adhesive layer, said base film having a thickness of 10 to 300 μm and comprising (i) an olefinic thermoplastic elastomer comprising propylene and ethylene and/or α-olefin including 4 to 8 carbon atoms as polymerization components, said olefinic thermoplastic elastomer has a peak melting temperature of 120 to 170° C., and (ii) a crystal-nucleating agent having a crystal-nucleating action on polypropylene, said base film, wherein the content of the crystal-nucleating agent is 0.0001 to 1% by weight relative to the whole of the base film, said adhesive layer having a thickness of 1 to 200 μm and having a surface removable from the material after being diced.

2. The dicing sheet according to claim 1, wherein said base film further comprises an ethylene series polymer containing ethylene as a major polymerization component.

3. The dicing sheet according to claim 1, wherein said base film further comprises an ethylene series polymer containing ethylene as a major polymerization component.

* * * * *

UNITED STATES PATENT AND TRADEMARK OFFICE
CERTIFICATE OF CORRECTION

PATENT NO. : 7,141,300 B2
APPLICATION NO. : 10/172893
DATED : November 28, 2006
INVENTOR(S) : Shouji Yamamoto and Kenjiro Takayanagi It is certified that error appears in the above-identified patent and that said Letters Patent is hereby corrected as shown below:

Column 3, lines 11-12: Delete "stretch ability" and insert --stretchablity--, therefor.

Column 4, line 38: Delete "stretch ability" and insert --stretchability--, therefor.

Column 6, lines 14, After "tape" insert --.--.

Column 6, line 29: Delete "50to" and insert --50 to--, therefor.

Column 7, line 13: Delete "Ti(OR$^2$)$_{4-2)}$X$_N$" and insert --Ti(OR$^2$)$_{(4-2)}$X$_N$--, therefor.

Column 9, line 60: Delete "there of" and insert --thereof--, therefor.

Column 10, line 8: Delete "there of" and insert --thereof--, therefor.

Column 11, line 51: Delete "phosph ate" and insert --phosphate--, therefor.

Column 11, lines 52-53: Delete "phos-pha te" and insert --phos-phate--, therefor.

Column 11, line 55: Delete "phos phate" and insert --phosphate--, therefor.

Column 11, line 57: Delete "phosp hate" and insert --phosphate--, therefor.

Column 11, line 59: Delete "phosp hate" and insert --phosphate--, therefor.

Column 11, line 63: Delete "phosp hate" and insert --phosphate--, therefor.

UNITED STATES PATENT AND TRADEMARK OFFICE
CERTIFICATE OF CORRECTION

PATENT NO. : 7,141,300 B2
APPLICATION NO. : 10/172893
DATED : November 28, 2006
INVENTOR(S) : Shouji Yamamoto and Kenjiro Takayanagi It is certified that error appears in the above-identified patent and that said Letters Patent is hereby corrected as shown below:

Column 13, line 12: Delete "A" and insert --a--, therefor.

Signed and Sealed this

Fifth Day of June, 2007

JON W. DUDAS
*Director of the United States Patent and Trademark Office*